(12) United States Patent
Yasui et al.

(10) Patent No.: US 10,671,049 B2
(45) Date of Patent: Jun. 2, 2020

(54) OPTIMIZATION DEVICE OF COMPONENT MOUNTING LINE AND OPTIMIZATION METHOD OF COMPONENT MOUNTING LINE

(71) Applicant: FUJI MACHINE MFG. CO., LTD., Chiryu-shi (JP)

(72) Inventors: Yoshihiro Yasui, Anjo (JP); Hitoshi Kobayashi, Toyohashi (JP)

(73) Assignee: FUJI CORPORATION, Chiryu-shi (JP)

( * ) Notice: Subject to any disclaimer, the term of this patent is extended or adjusted under 35 U.S.C. 154(b) by 219 days.

(21) Appl. No.: 15/561,300

(22) PCT Filed: Mar. 26, 2015

(86) PCT No.: PCT/JP2015/059336
§ 371 (c)(1),
(2) Date: Sep. 25, 2017

(87) PCT Pub. No.: WO2016/151833
PCT Pub. Date: Sep. 29, 2016

(65) Prior Publication Data
US 2018/0101161 A1  Apr. 12, 2018

(51) Int. Cl.
| G05B 19/406 | (2006.01) |
| G05B 19/418 | (2006.01) |
| H05K 13/08 | (2006.01) |

(52) U.S. Cl.
CPC ......... *G05B 19/406* (2013.01); *G05B 19/418* (2013.01); *H05K 13/085* (2018.08); *G05B 2219/35059* (2013.01); *Y02P 90/04* (2015.11)

(58) Field of Classification Search
None
See application file for complete search history.

(56) References Cited

U.S. PATENT DOCUMENTS

| 5,258,915 A | 11/1993 | Billington et al. |
| 2004/0153868 A1* | 8/2004 | Nonaka ............ G05B 19/41805 714/47.2 |

(Continued)

FOREIGN PATENT DOCUMENTS

| JP | 2003-283198 A | 10/2003 |
| JP | 3583121 B2 | 10/2004 |

(Continued)

OTHER PUBLICATIONS

Morita Yukitoshi, System for Determining Production Schedule (English translation of WIPO publication No. WO2014041686A1), Published Mar. 20, 2014, retrieved from the internet <https://patentscope.wipo.int/search/en/detail.jsf?docId=WO2014041686> (Year: 2014).*

(Continued)

*Primary Examiner* — Kenneth M Lo
*Assistant Examiner* — Istiaque Ahmed
(74) *Attorney, Agent, or Firm* — Oblon, McClelland, Maier & Neustadt, L.L.P.

(57) ABSTRACT

An optimization device of a component mounting line of the present invention includes a cycle time calculating section which calculates respective cycle times required for mounting components of component types which are allocated to each of the component mounting machines by the optimization process onto a single board, an excluded machine setting section which sets a specific portion of the component mounting machines to be excluded from further calculation processes, a balance efficiency calculating section which calculates a line balance efficiency indicating a degree to which the cycle times of the component mounting machines which are not excluded are equalized, and a balance efficiency display section which displays the line balance efficiency. Accordingly, the results of the optimiza- (Continued)

tion process which is carried out before starting production of the board are evaluated appropriately and the original device performance of the component mounting line can be utilized.

18 Claims, 6 Drawing Sheets

(56) References Cited

U.S. PATENT DOCUMENTS

| | | | |
|---|---|---|---|
| 2008/0228304 A1 | 9/2008 | Maenishi et al. | |
| 2012/0253499 A1* | 10/2012 | Nakamura | H05K 13/0417 700/121 |
| 2014/0090244 A1 | 4/2014 | Sakamoto | |
| 2016/0041803 A1* | 2/2016 | Markov | A01B 76/00 701/48 |

FOREIGN PATENT DOCUMENTS

| | | |
|---|---|---|
| JP | 2006-13448 A | 1/2006 |
| JP | 2006-269754 A | 10/2006 |
| JP | 2008-217451 A | 9/2008 |
| JP | 2009-200427 A | 9/2009 |
| JP | 2013-4596 A | 1/2013 |
| JP | 2013-110371 A | 6/2013 |
| JP | 2013-115218 A | 6/2013 |
| JP | 2013115218 A * | 6/2013 |
| JP | 2014-27227 A | 2/2014 |
| WO | WO-2014041686 A1 * | 3/2014 ....... G05B 19/41865 |
| WO | WO 2015/025408 A1 | 2/2015 |

OTHER PUBLICATIONS

Teruyuki Ohashi, Electronic Component Mounting System, (English translation of the specification of Japanese Patent publication No. JP2013115218A), Published Jun. 10, 2013, retrieved from the internet <https://globaldossier.uspto.gov/#/details/JP/2011259574/A/82792> (Year: 2013).*

Extended European Search Report dated Jun. 1, 2018 in European Patent Application No. 15886386.0, 10 pages.

Extended European Search Report dated Aug. 31, 2018 in Patent Application No. 18168246.9.

International Search Report dated Jun. 30, 2015, in PCT/JP2015/059336 filed Mar. 26, 2015.

* cited by examiner

| PROCESSING CONDITIONS | SCORE | ALLOTMENT |
|---|---|---|
| PROCESSING CONDITIONS 1 | 7 | 10 |
| PROCESSING CONDITIONS 2 | 5 | 5 |
| PROCESSING CONDITIONS 3 | 5 | 5 |
| PROCESSING CONDITIONS 4 | 0 | 5 |
| PROCESSING CONDITIONS 5 | 0 | 5 |
| PROCESSING CONDITIONS 6 | 10 | 10 |
| PROCESSING CONDITIONS 7 | 0 | 10 |
| PROCESSING CONDITIONS 8 | 3 | 5 |
| PROCESSING CONDITIONS 9 | 3 | 5 |
| PROCESSING CONDITIONS 10 | 7 | 10 |
| SUM | 40 | 70 |

OPTIMIZATION DEVICE OF COMPONENT MOUNTING LINE AND OPTIMIZATION METHOD OF COMPONENT MOUNTING LINE

FIELD

The present disclosure relates to a component mounting line in which multiple component mounting machines are arranged in series, specifically, the present disclosure relates to an optimization device and an optimization method which carry out an optimization process based on setting-changeable processing conditions before starting the production of aboard in a component mounting line.

BACKGROUND

Examples of facilities which produce aboard onto which multiple components are mounted include a solder printing machine, a component mounting machine, a reflow machine, and a board inspection machine. It is common to link such facilities to configure a board product ion line. Furthermore, there are many cases in which multiple component mounting machines are arranged in series to configure a component mounting line. In order to sufficiently utilize the original device performance of a component mounting line to efficiently produce boards, technology is developed in which an optimization process is performed before starting the production. In the optimization process, multiple components to be mounted onto boards are allocated to multiple component mounting machines, and a simulation is performed to shorten and equalize cycle times which are required for mounting the components to a single board using each of the component mounting machines. In the simulation, changeable processing conditions are set in consideration of the properties of the board to be produced. Technical examples relating to this kind of optimization process are disclosed in PTL 1 (JP-A-2008-217451) and PTL 2 (Japanese Patent No. 3583121).

In an automatic production information collection system of PTL 1, in the production line in which multiple operators are arranged in order, the work time for each worker is acquired and the line balance efficiency of the work time is calculated and displayed. Accordingly, it is assumed that it is possible to ascertain the line balance efficiency in real time during the production, to ascertain factors which hinder the production, and to cope with improvements in production efficiency in real time. In other words, although there are differences between operators and component mounting machines, the object of improving the efficiency of production lines by equalizing the workload is common, and the line balance efficiency is used as an evaluation index.

Amounting tact monitoring method of PTL 2 collects and monitors a mounting tact actual value (the actual value of the cycle time) during operation from the component mounting machine, calculates the tact loss based on the mounting tact actual value and a standard mounting tact of a case in which the component mounting machine operates without loss, and analyzes causes of losses in the mounting tact actual value. Furthermore, according to the description of the embodiment, performing a theoretical calculation of the mounting tact and the tact loss instead of the mounting tact actual value is disclosed. Furthermore, a theoretical calculation of the mounting tact balance in the component mounting line is also disclosed, and the line balance efficiency is obtained using a simulation.

Incidentally, unlike the others, the structure of a portion of component mounting machines which configure a component mounting line may be allocated components of a specific component type. For example, there is a line configuration in which many of the component mounting machines are provided with feeder devices, and some of the component mounting machines are provided with tray devices. In this case, large-sized components which are supplied from the tray devices are allocated in a limited manner to the portion of the component mounting machines. For example, there is a line configuration in which only specific component mounting machines include an abnormal shape suction nozzle and are allocated only special odd-shaped components.

In such a line configuration, a component mounting machine to which components of a specific component type are allocated tends to have a small cycle time due to a limited number of component mounting points. Accordingly, the line balance efficiency worsens and evaluation of the optimization process becomes difficult. In a component mounting machine to which components of a specific component type are allocated, it is not possible to change the allocation of the components and it is difficult to improve the line balance efficiency. Therefore, when evaluating the optimization results and the line balance efficiency, it is favorable to exclude the component mounting machines to which components of a specific component type are allocated from consideration.

Meanwhile, the processing conditions which are set during the optimization process are not limited to being always set optimally. For example, a certain upper limit time is defined as a default value such that the optimization time which can be spent on the optimization process does not become an excessive processing time. Due to this restriction, there are often cases in which the optimization process is cut off before excellent optimization results are obtained, the process transitions to production, and the original device performance of the component mounting line may no longer be utilized. In the processing conditions, default conditions on the safe side which do not hinder the production of the board are set initially, and adverse effects due to the operator forgetting to set settings are prevented. Therefore, the operator may set appropriate processing conditions according to the board type of the board to be produced; however, the optimization processing being performed with default conditions unchanged occurs.

Furthermore, since it is unknown as to whether or not the operator at the workplace set the optimum processing conditions even if the optimization results are output, it is difficult to determine whether or not the optimization results are favorable and it is difficult to find improvement points. As a result, the component mounting line becomes unable to utilize the original device performance. Therefore, it is extremely important to set appropriate processing conditions, carry out the optimization process, and appropriately evaluate the optimization results.

SUMMARY

The present disclosure is made in consideration of the problems of the above background art, and the object to solve is to provide an optimization device and an optimization method of a component mounting line which appropriately evaluate the results of an optimization process which is carried out before starting production of boards on a component mounting line or to clarify the setting status of processing conditions which are variably set in the optimization process to enable the utilization of the original device performance.

In order to solve the problems, according to the present disclosure, there is provided an optimization device of a component mounting line which carries out an optimization process relating to production based on setting-changeable processing conditions when producing a board on the component mounting line in which multiple component mounting machines are arranged in series, each of the component mounting machines including a board conveyance device which carries in the board to a mounting execution position, positions the board, and carries out the board, a component supply device which sequentially supplies components, and a component transfer device which picks the components from the component supply device and mounts the components onto the positioned board, the optimization device including a cycle time calculating section which calculates respective cycle times required for mounting components of component types which are allocated to each of the component mounting machines by the optimization process onto a single board, an excluded machine setting section which sets a specific portion of the component mounting machines to be excluded from further calculation processes, a balance efficiency calculating section which calculates a line balance efficiency indicating a degree to which the cycle times of the component mounting machines which are not excluded are equalized, and a balance efficiency display section which displays the line balance efficiency.

Accordingly, after the specific component mounting machines which are likely to become a cause of worsening the line balance efficiency are excluded from the calculation process, the line balance efficiency is calculated and displayed. Therefore, the operator is capable of checking the line balance efficiency which is effective to appropriately evaluate the results of the optimization process without the line balance efficiency being worsened by a specific component mounting machine. When the line balance efficiency is not favorable, the operator is capable of updating the settings of the processing conditions, carrying out the optimization process again, obtaining excellent optimization results, and utilizing the original device performance of the component mounting line.

In order to solve the problems, according to the present disclosure, there is provided an optimization device of a component mounting line which carries out an optimization process relating to production based on setting-changeable processing conditions when producing a board on the component mounting line in which multiple component mounting machines are arranged in series, each of the component mounting machines including aboard conveyance device which carries in the board to a mounting execution position, positions the board, and carries out the board, a component supply device which sequentially supplies components, and a component transfer device which picks the components from the component supply device and mounts the components onto the positioned board, the optimization device may include a cycle time calculating section which calculates respective cycle times required for mounting components of component types which are allocated to each of the component mounting machines by the optimization process onto a single board, a shortest time calculating section which calculates respective shortest cycle times in which it is possible to mount components of component types which are allocated to each of the component mounting machines by the optimization process on a single board under mount-execution conditions at which it is anticipated that mounting efficiency will be highest, an operation efficiency calculating section which calculates respective operation efficiencies indicating a degree to which the cycle time of each of the component mounting machines approaches the shortest cycle time, and an operation efficiency display section which displays the operation efficiencies.

Accordingly, the operation efficiency indicating the degree to which the cycle time approaches the shortest cycle time is calculated and displayed for each of the component mounting machines. Therefore, the operator is capable of checking the operation efficiency of each of the component mounting machines and appropriately evaluating the results of the optimization process. When the operation efficiency is low, the operator is capable of amending inappropriate settings and forgotten settings of the processing conditions which are a cause, carrying out the optimization process again, obtaining excellent optimization results, and utilizing the original device performance of the component mounting line.

In order to solve the problems, according to the present disclosure, there is provided an optimization device of a component mounting line which carries out an optimization process relating to production based on setting-changeable processing conditions when producing a board on the component mounting line in which multiple component mounting machines are arranged in series, each of the component mounting machines including aboard conveyance device which carries in the board to a mounting execution position, positions the board, and carries out the board, a component supply device which sequentially supplies components, and a component transfer device which picks the components from the component supply device and mounts the components onto the positioned board, the optimization device may include an effectiveness degree calculating section which calculates an effectiveness degree of optimization of the processing conditions which are set for carrying out the optimization process, and an effectiveness degree display section which displays the effectiveness degree of the optimization.

Accordingly, the effectiveness degree of the optimization of the processing conditions which are set is calculated and displayed. Therefore, the operator is capable of checking the effectiveness degree and determining whether or not the optimization process is performed under appropriate processing conditions. When the effectiveness degree is low, the operator is capable of amending inappropriate settings and forgotten settings of the processing conditions which are a cause, carrying out the optimization process again, obtaining excellent optimization results, and utilizing the original device performance of the component mounting line.

DETAILED DESCRIPTION

1. Configuration Examples of Component Mounting Line 1 and Component Mounting Machine 2

Figure 1:
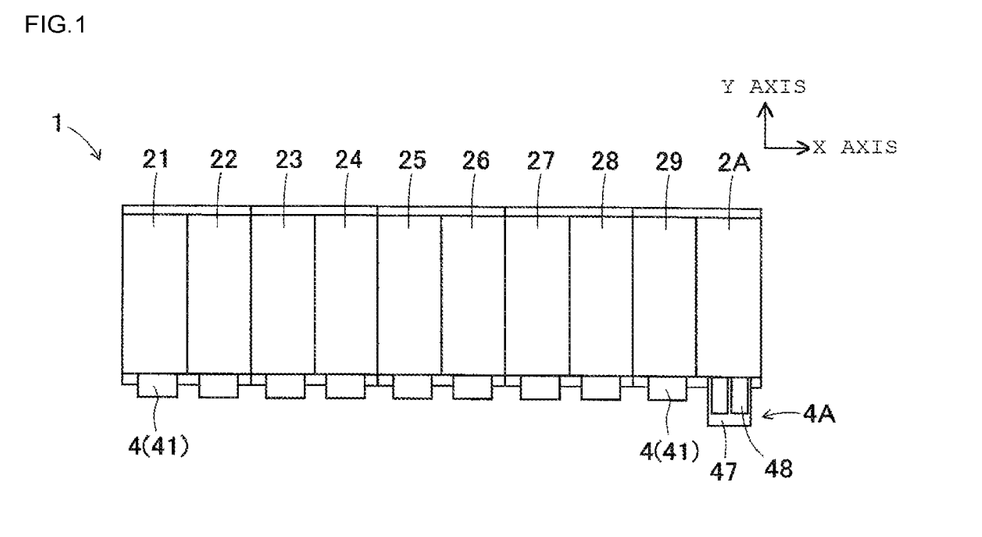
FIG. 1 is a plan view schematically illustrating a configuration example of a component mounting line which serves as a target of an optimization device of an embodiment.
Figure 2:
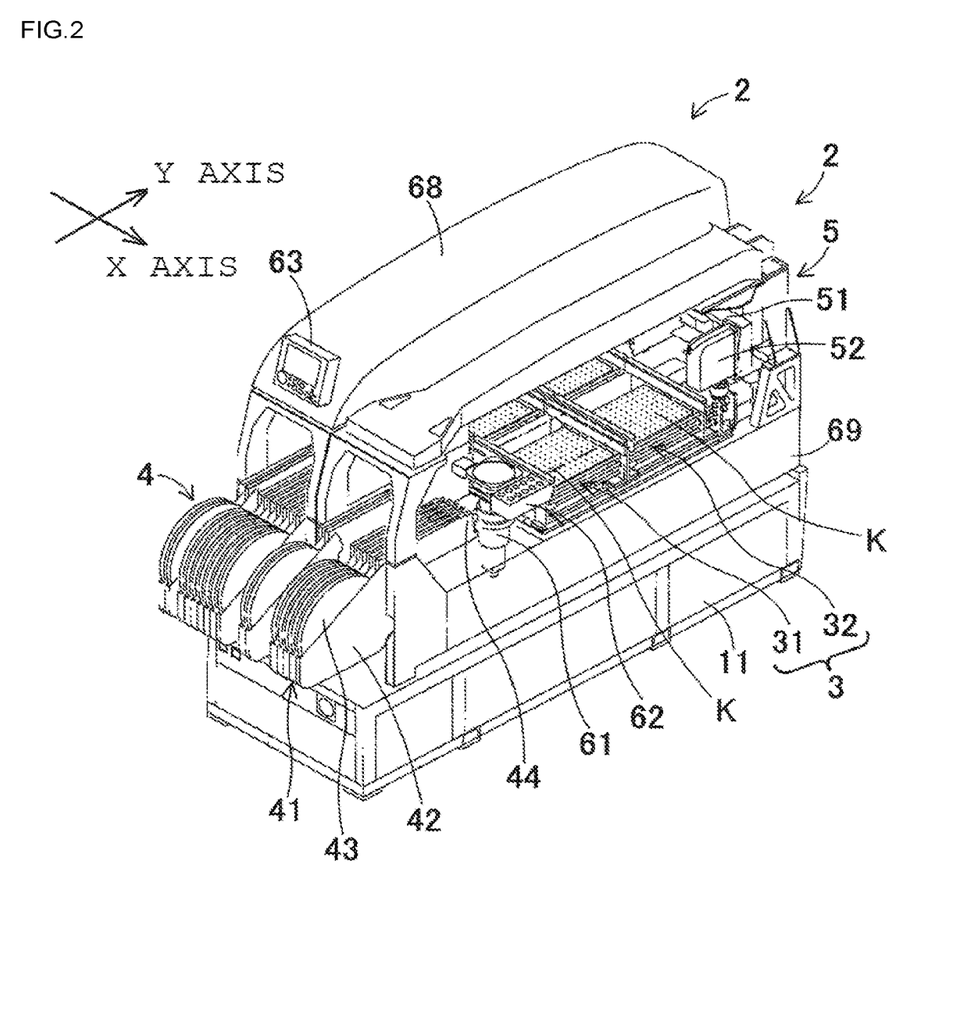
FIG. 2 is a perspective view illustrating two component mounting machines.

First, description will be given of the configuration examples of the component mounting line 1 and the component mounting machine 2 with reference to FIGS. 1 and 2. FIG. 1 is a plan view schematically illustrating the configuration example of the component mounting line 1 which serves as a target of an optimization device 7 of the embodiment. As illustrated, the component mounting line 1 is configured such that ten first to tenth component mounting machines 21 to 2A are arranged in series. The first component mounting machine 21 of the left side in the drawing is the upstream side and the tenth component mounting machine 2A of the right side is the downstream side. As illustrated by the XY-coordinate axes in the drawing, a direction in which a board K is conveyed in the order of the first to the tenth component mounting machine 21 to 2A is the X-axis direction, and a direction orthogonal to the X-axis direction in a horizontal plane is the Y-axis direction. FIG. 2 is a perspective view illustrating the two component mounting machines 2. The component mounting machine 2 is configured by a board conveyance device 3, a component supply device 4, a component transfer device 5, a component camera 61, a nozzle station 62, a control device, and the like being assembled onto a device table 69.

The board conveyance device 3 is arranged in the vicinity of the center of the component mounting machine 2 in the longitudinal direction (the Y-axis direction). The board conveyance device 3 is a so-called double conveyor type device in which a first conveyance device 31 and a second conveyance device 32 are provided to line up. The first and the second conveyance devices 31 and 32 each include a pair of guide rails, a pair of conveyor belts, a backup device, and the like which are not illustrated. The pair of guide rails are disposed to extend in the conveyance direction (the X-axis direction). A pair of endless ring-shaped conveyor belts are provided to line up on the inside of the two guide rails which face each other. The pair of conveyor belts are rotated by wheels with the board K placed on a conveyor conveyance surface, and carry in and carryout the board K to and from a mounting execution position. The backup device is installed under the mounting execution position. The backup device pushes up the board K, clamps the board K in a horizontal posture, and positions the board K at the mounting execution position.

The component supply device 4 is provided on the front portion (the front left side of FIG. 2) of the component mounting machine 2 in the longitudinal direction. The component supply device 4 is configured to have multiple feeder devices 41 lined up. The feeder device 41 includes a main body section 42, a supply reel 43, and a component supply section 44. The supply reel 43 is mounted to the rear portion of the main body section 42 in a rotatable and a detachable manner and the component supply section 44 is provided on a leading end top portion of the main body section 42. A carrier tape which holds components at a fixed interval is wound on the supply reel 43. The leading end of the carrier tape is pulled out to the component supply section 44 and the components are supplied.

The component transfer device 5 is a so-called XY-robot type device which is capable of moving in the X-axis direction and the Y-axis direction. The component transfer device 5 is installed from the rear portion (the far right side in FIG. 2) of the component mounting machine 2 in the longitudinal direction to above the component supply device 4. The component transfer device 5 is configured by a head driving mechanism 51, a mounting head 52, and the like. The mounting head 52 holds, in a detachable manner, one or multiple suction nozzles that suck and mount components. The head driving mechanism 51 drives the mounting head 52 in the X-axis direction and the Y-axis direction.

The component camera 61 is provided to face upward on the upper face of the device table 69 between the component supply device 4 and the first conveyance device 31. The component camera 61 images the state of the component which is sucked by the suction nozzle part way through the mounting head 52 moving above the board K from the component supply device 4. The nozzle station 62 is installed on the device table 69 adjacent to the component camera 61. The nozzle station 62 holds suction nozzles in corresponding multiple nozzle holding holes to be capable of exchanging the suction nozzles.

The control device which is not illustrated holds a mounting sequence which indicates the types and the mounting order of the components to be mounted to the board K, the feeder device 41 which supplies the relevant components, and the like. The control device controls the component mounting operations according to the mounting sequence based on the captured image data of the component camera 61 and detection data and the like of sensors which are not illustrated. The control device sequentially collects and updates operation condition data such as the production number of the boards K for which the production is completed, the mounting time required for mounting the components, the number of occurrences of a component suction error, and the like. The control device includes a monitor device 63 which is installed on the top portion of the front side of a cover 68 of the top portion. The monitor device 63 has a display section for displaying information to an operator and an input section for performing input settings by the operator.

Each of the first to the ninth component mounting machines 21 to 29 which configure the component mounting line 1 is provided with the component supply device 4 which is formed from the multiple feeder devices 41. Only the tenth component mounting machine 2A which is most downstream is provided with a component supply device 4A which is formed from a tray device 47 (illustrated in FIG. 1). In the tray device 47, large odd-shaped components are placed on a tray 48 which can be exchanged and the components are supplied. Furthermore, the mounting head 52 of the component transfer device 5 of the tenth component mounting machine 2A holds a special abnormal shape suction nozzle which sucks the odd-shaped components. Therefore, the number of types and the number of components of the component types which are allocated to the tenth component mounting machine 2A are few in comparison with the other first to ninth component mounting machines 21 to 29. Additionally, it is not possible to exchange the allocated component types between the tenth component mounting machine 2A and the other first to ninth component mounting machines 21 to 29.

Figure 3:
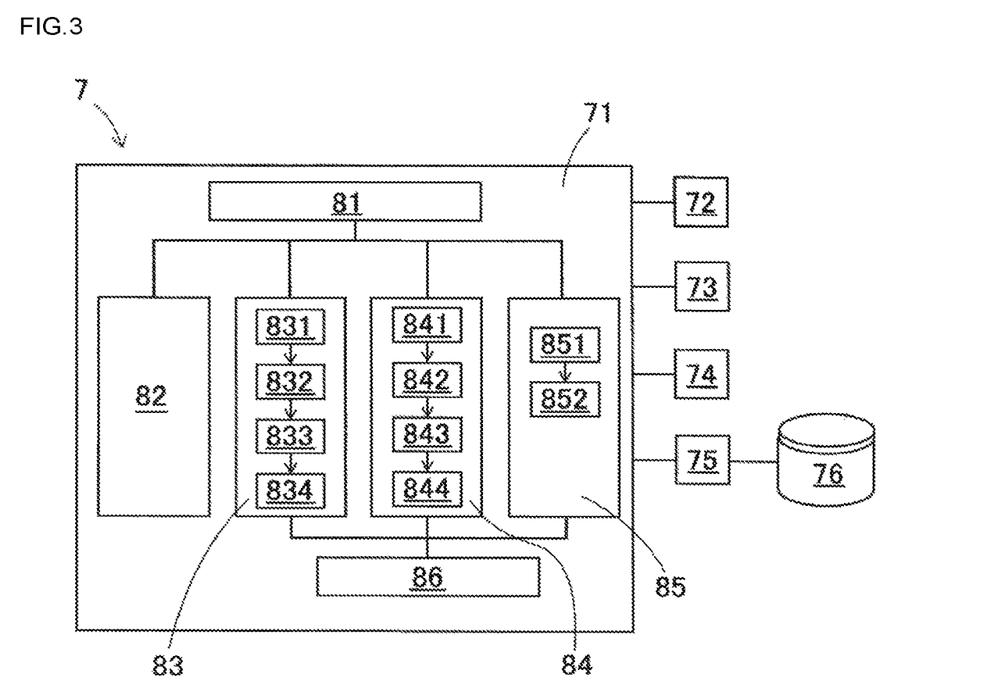
FIG. 3 is a block diagram illustrating a device configuration and a functional configuration of the optimization device of the component mounting line of the embodiment.

2. Configuration of Optimization Device 7 of Component Mounting Line of Embodiment Next, description will be given of the configuration of the optimization device 7 of the component mounting line of the embodiment. FIG. 3 is a block diagram illustrating the device configuration and the functional configuration of the optimization device 7 of the component mounting line of the embodiment. The optimization device 7 is configured using a computer device 71 and software which operates on the computer device 71. The computer device 71 is provided with an input section 72, a display section 73, a memory section 74, and a communication section 75. The input section 72 is a part in which the input setting is performed by the operator. The display section 73 is a part which displays information to the operator. The memory section 74 is a part which stores various software, processing conditions of when the software is performed, process results, and the like. The communication section 75 is a part which transfers information via communication with an external memory device and other computer devices.

In the present embodiment, the computer device 71 is connected to a job database 76 via the communication section 75. Even each of the control devices of the first to the tenth component mounting machines 21 to 2A is capable of accessing the job database 76. The job database 76 holds information which is used when the computer device 71 carries out the optimization process. For example, the job database 76 holds information relating to the board K to be produced, information relating to the components to be mounted, information relating to dimensional data and performance of the first to the tenth component mounting machines 21 to 2A which configure the component mounting line 1, and the like. Not limited thereto, information which is used when carrying out the optimization process may be held in the memory section 74.

Functionally, the optimization device 7 is provided with a process selecting section 81, an optimization processing section 82, a line balance processing section 83, an operation efficiency processing section 84, an effectiveness degree processing section 85, and a common display section 86.

The process selecting section 81 is a part which selects and carries out any of the optimization processing section 82, the line balance processing section 83, the operation efficiency processing section 84, and the effectiveness degree processing section 85. The selection can be performed by manual manipulation of the operator from the input section 72. The process selecting section 81 may automatically perform the selection. For example, every time the updating of a job which performs the optimization process is performed by the job database 76, the process selecting section 81 is capable of selecting the optimization processing section 82 and carrying out the optimization process of the job. The process selecting section 81 is capable of selecting and carrying out multiple sections from among the line balance processing section 83, the operation efficiency processing section 84, and the effectiveness degree processing section 85, and in this case, the common display section 86 functions.

The optimization processing section 82 carries out an optimization process relating to the production based on the setting-changeable processing conditions before starting the production of the board K in the component mounting line 1. Before carrying out the optimization process, the operator sets the processing conditions. The set processing conditions are held in the memory section 74. The default conditions are held in the memory section 74 such that the optimization process is carried out without delay even if the operator does not set the processing conditions. For the default conditions, conditions on the safe side are initially set such that no hindrance arises in the production regardless of the board type of the board K.

It is possible to exemplify the handling conditions of the board K and the handling conditions of the components as the setting-changeable processing conditions. The handling conditions of the board K mean the conditions of the time at which the board conveyance devices 3 of the first to the tenth component mounting machines 21 to 2A handle the boards K. The conveyance speed and the conveyance acceleration of the board K, the operation condition during the positioning of the board K by the backup device, and the like correspond to the handling conditions of the board K. For the default values of the conveyance speed and the conveyance acceleration of the board K, values which are small to an extent are set such that reliable conveyance is performed no matter what the board type is. The default values of the operation conditions during the positioning of the board K are set in consideration of a maximum height Hmax such that no hindrances arise even if the board K is a double-sided mounting board and even if the component of the maximum height Hmax is already mounted on the lower face.

The handling conditions of the components mean the conditions of the time at which the component transfer devices 5 of the first to the tenth component mounting machines 21 to 2A handle the components. The type of suction nozzle which is used in the suction of the components, the operation speed and acceleration in the vertical direction when the suction nozzle sucks and mounts the components, and the operation speed and acceleration in the horizontal direction when the suction nozzle moves from the component supply device 4 to the board K of the mounting execution position in a state in which the suction nozzle sucks the component, and the like correspond to the handling conditions of the components. The type of the suction nozzle is set within the maximum range at which the target components can be sucked and held. The maximum values in the component transfer device 5 are set as the default values for the operation speed and acceleration in the vertical direction and the horizontal direction. However, there are cases in which different setting values from the default values are set according to other types of the component transfer device. The appropriate operation speed and acceleration also differ depending on the type of the suction nozzle which is used by the component transfer device 5.

Here, the handling conditions of the board K and the components are not necessarily fixed conditions, and production of the board K is possible even if a setting change is performed within a certain range. Therefore, when the settings of the handling conditions are changed according to the board K which is actually to be produced and the actual state of the components to be mounted, the opportunities for further excellent optimization results to be obtained are increased. Accordingly, the original device performance of the component mounting line 1 can be utilized.

Furthermore, the optimization time which can be spent on the optimization process is included in the setting-changeable processing conditions. The default value of the optimization time is a short minimum time such that it is possible to transition smoothly to the production without spending much processing time. However, in a case in which the production is not rushed, it is preferable to change the setting of the optimization time to long and carry out the optimization process taking sufficient time.

As a target item to be subjected to the optimization process, for example, there is an allocation method in which the component types and the number of components of many components to be mounted to the board K are allocated to the first to the tenth component mounting machines 21 to 2A. Here, in the tenth component mounting machine 2A, the structure of the component supply device 4A is different from the others and the components which are allocated are limited to specific component types which are supplied from the tray device 47. In contrast, the component types which are allocated to the first to the ninth component mounting machines 21 to 29 are not limited. Therefore, the remaining majority of the component types are appropriately allocated to the first to the ninth component mounting machines 21 to 29, and shortening and equalizing the respective cycle times thereof becomes the object of the optimization process.

The mounting order of the components which are allocated to each of the first to the tenth component mounting machines 21 to 2A, the lining up order of the feeder devices 41 of the first to the ninth component mounting machines 21 to 2A, and the like are also target items on which to carry out the optimization process. The operation efficiency of the component transfer device 5 fluctuates depending on the mounting order of the components and the lining up order of the feeder devices 41 and influences the cycle time.

The optimization results which are obtained by the optimization process are temporarily held in the memory section 74. In a case in which the optimization process is performed multiple times, the most excellent optimization results are held in the memory section 74. The final optimization results are transferred to the control device of the first to the tenth component mounting machines 21 to 2A via the communication section 75 and are used in the production of the boards K. With regard to a specific embodiment method of the optimization process, it is possible to adapt various well-known methods, as appropriate.

3. Functions of Line Balance Processing Section 83

Figure 4:
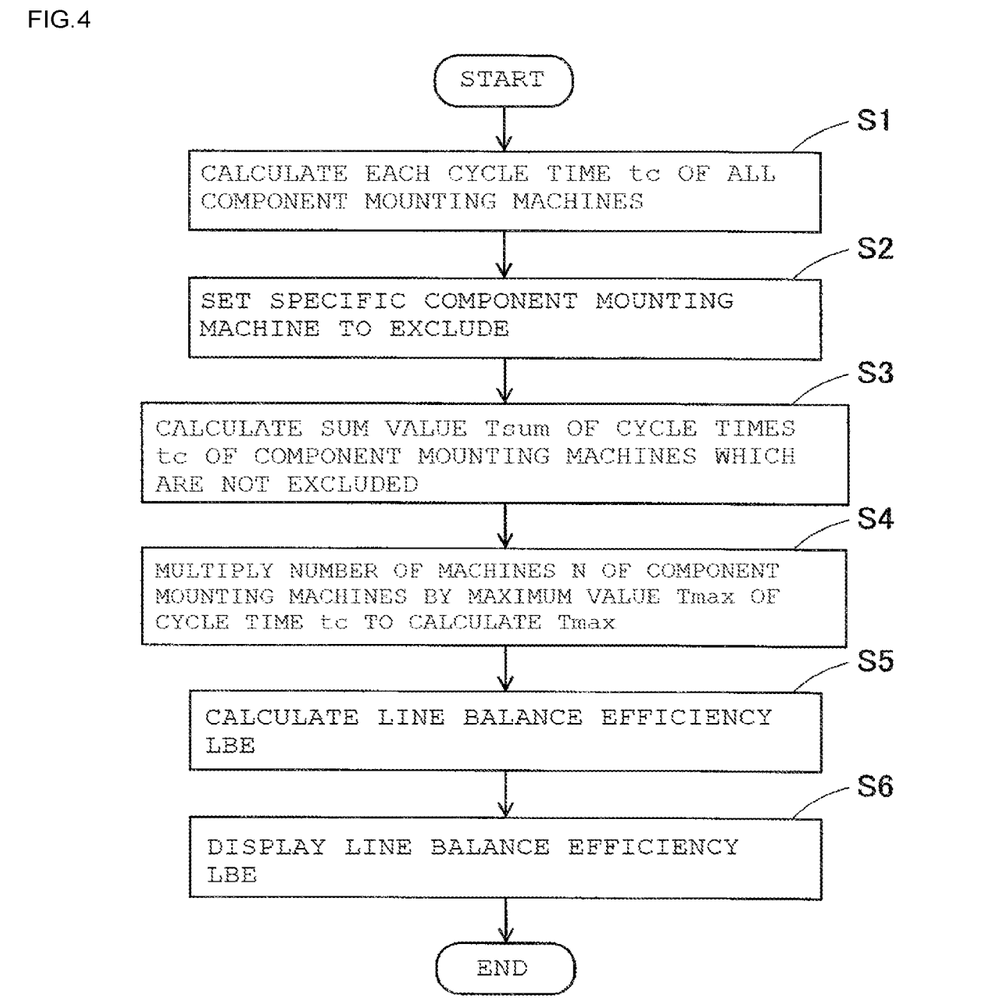
FIG. 4 is a diagram of a process flow which explains the process content of a line balance processing section.
Figure 5:
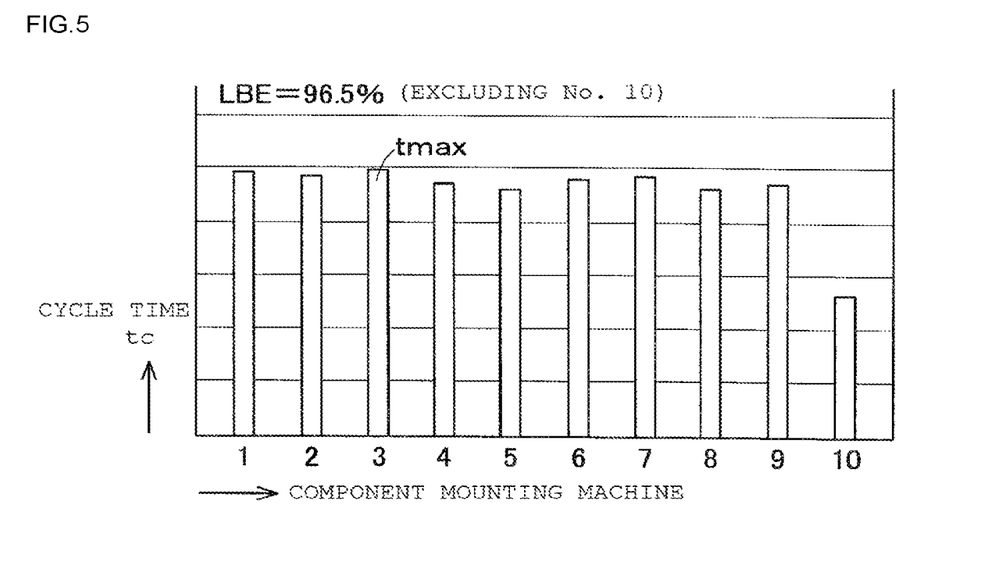
FIG. 5 is a diagram of a display example which explains by example the process results of the line balance processing section.

The line balance processing section 83 excludes a specific portion of the component mounting machines and calculates and displays a line balance efficiency LBE based on the optimization results which are obtained by the optimization processing section 82. The line balance processing section 83 is provided with a cycle time calculating section 831, an excluded machine setting section 832, a balance efficiency calculating section 833, and a balance efficiency display section 834. FIG. 4 is a diagram of a process flow which explains the process content of the line balance processing section 83. FIG. 5 is a diagram of a display example which explains by example the process results of the line balance processing section 83.

In step S1 of FIG. 4, the cycle time calculating section 831 calculates each of the cycle times tc required for mounting the components of the component types which the corresponding component mounting machines 21 to 2A are allocated by the optimization process onto the single board K. At this time, the cycle time calculating section 831 uses the set processing conditions in addition to the various information of the job database 76. As illustrated in the bar graph in the display example of FIG. 5, the cycle times tc of the first to the ninth component mounting machines 21 to 29 are substantially equalized even if there is a little difference. In contrast, the cycle time tc of the tenth component mounting machine 2A is notably shorter than the others.

In the next step S2, the excluded machine setting section 832 sets a specific portion of the component mounting machines to be excluded from further calculation processes. Specifically, the excluded machine setting section 832 excludes any of component mounting machines in which the cycle time tc is shorter than the others, component mounting machines in which the number of types or the number of components of the allocated component types is fewer than the others, and component mounting machines in which the structure of at least one of the component supply device 4A and the component transfer device 5 is different from the others and components of specific component types are allocated. The excluded machine setting section 832 excludes the tenth component mounting machine 2A which corresponds to all of the exclusion conditions.

The number of excluded machines is not limited to one and may be many. For example, there is a case in which the total number of components to be mounted to the board K is few and components are not allocated to the eighth component mounting machine 28. Therefore, the eighth component mounting machine 28 only conveys the board K therethrough and has an extremely short cycle time tc. In this case, the excluded machine setting section 832 excludes the eighth component mounting machine 28 and the tenth component mounting machine 2A.

In steps S3 to S5, the balance efficiency calculating section 833 calculates the line balance efficiency LBE which indicates the degree to which the cycle times of the component mounting machines which are not excluded are equalized using the following equation 1.

$$\text{LBE (\%)} = (T\text{sum} \div T\text{max}) \times 100 \quad \text{(Equation 1)}$$

Specifically, in step S3, the balance efficiency calculating section 833 calculates the sum value Tsum which is the result of obtaining the sum of the cycle times tc of the first to the ninth component mounting machines 21 to 29 which are not excluded. In step S4, the balance efficiency calculating section 833 multiplies the number N of component mounting machines which are not excluded by the maximum value tmax of the cycle time tc to calculate Tmax. In the display example of FIG. 5, the maximum value tmax of the cycle time tc is generated by the third component mounting machine 23. The number N of the first to the ninth component mounting machines 21 to 29 which are not excluded is N=9. In step S5, the balance efficiency calculating section 833 calculates the line balance efficiency LBE using equation 1.

The line balance efficiency LBE may perform the calculation using the following equation 2 which is a modification of equation 1.

$$\text{LBE (\%)} = (t\text{av} \div t\text{max}) \times 100 \quad \text{(Equation 2)}$$

Where tav is an average value obtained by averaging the cycle times tc of the first to the ninth component mounting machines 21 to 29 which are not excluded, and tmax is a maximum value of the cycle times tc (the value of the third component mounting machine 23).

In the next step S6, the balance efficiency display section 834 displays the line balance efficiency LBE together with the bar graph of the cycle times tc. In the display example of FIG. 5, "LBE=96.5% (excluding No. 10)" is displayed and the numerical value of the line balance efficiency LBE and the excluded machines are displayed.

Hypothetically, if the tenth component mounting machine 2A is not excluded, the line balance efficiency LBE will worsen to approximately 92%. Even if the operator views the worsened line balance efficiency LBE, it is difficult to evaluate the optimization results. In contrast, viewing the favorable line balance efficiency LBE 96.5% when the tenth component mounting machine 2A is excluded, the operator is capable of appropriately evaluating that the cycle times tc of the first to the ninth component mounting machines 21 to 29 are substantially equalized.

4. Functions of Operation Efficiency Processing Section 84

The operation efficiency processing section 84 calculates and displays each of the operation efficiencies M of the first to the tenth component mounting machines 21 to 2A based on the optimization results which are obtained by the optimization processing section 82. The operation efficiency processing section 84 is provided with a cycle time calculating section 841, a shortest time calculating section 842, an operation efficiency calculating section 843, and an operation efficiency display section 844. The cycle time calculating section 841 performs the same calculation process as the cycle time calculating section 831 of the line balance processing section 83 and calculates the respective cycle times tc of each of the component mounting machines 21 to 2A.

In contrast, the shortest time calculating section 842 calculates the respective shortest cycle times tmin in which it is possible to mount the components of the component types which are allocated to each of the component mounting machines 21 to 2A onto the single board K under mount-execution conditions which are anticipated to yield the highest mounting efficiency. The anticipated mount-execution conditions means the conditions under which it is possible to end the component mounting in the shortest without restricting the processing conditions which are set by the optimization processing section 82. Therefore, for example, for the conveyance speed and acceleration of the board K, and the operation speed and acceleration of the suction nozzle, the maximum values which are permitted are set in the mount-execution conditions. For example, in the anticipated mount-execution conditions, the types of suction nozzle which can be used in the suction of the components is widened to a maximum value, and the number of exchanges of the suction nozzle is minimized.

The operation efficiency calculating section 843 calculates the operation efficiency M indicating the degree to which the cycle time tc approaches the shortest cycle time tmin for each of the component mounting machines 21 to 2A using the following equation 3.

$$M(\%) = (tmin \div tc) \times 100 \quad \text{(Equation 3)}$$

Figure 6:
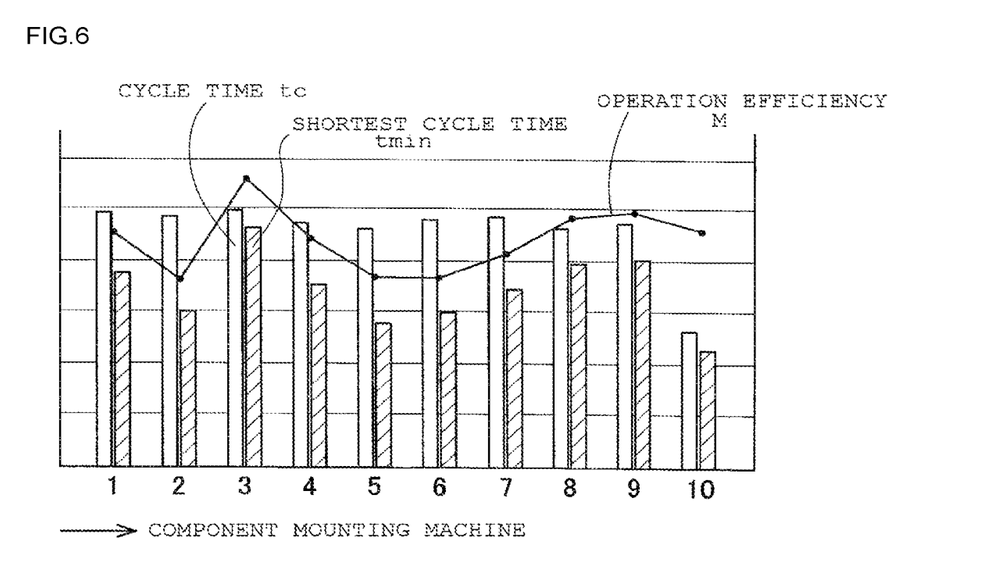
FIG. 6 is a diagram of a display example which explains by example the process results of an operation efficiency processing section.

FIG. 6 is a diagram of a display example which explains by example the process results of an operation efficiency processing section 84. As illustrated, the operation efficiency display section 844 displays the cycle time tc, the shortest cycle time tmin, and the operation efficiency M of each of the component mounting machines 21 to 2A. The cycle times tc are illustrated by white bar graphs, the shortest cycle times tmin are illustrated by hatched bar graphs, and the operation efficiencies M are illustrated by a line graph.

The cycle times tc and the shortest cycle times tmin are both values which are obtained by simulation; however, even so, the operation efficiencies M are valid in the evaluation of the actual mounting operations of each of the component mounting machines 21 to 2A. When the operation efficiency M is close to 100%, the operator can expect that the relevant component mounting machine will exhibit the original device performance. Conversely, when the operation efficiency M is low, the operator can reevaluate the optimization process. In other words, the operator investigates the cause of the operation efficiency M being low and in a case in which there are inappropriate settings, forgotten settings, or the like in the processing conditions, the operator amends the processing conditions and carries out the optimization process again.

5. Functions of Effectiveness Degree Processing Section 85

The effectiveness degree processing section 85 calculates and displays the effectiveness degree of the optimization of the set processing conditions after the optimization processing section 82 carries out the optimization process. However, even before carrying out the optimization process, if it is after the setting of the processing conditions by the operator is performed, the effectiveness degree processing section 85 is capable of operating. The effectiveness degree processing section 85 is provided with an effectiveness degree calculating section 851 and an effectiveness degree display section 852.

The effectiveness degree calculating section 851 sets individual allotments for multiple processing conditions and calculates and scores the effectiveness degree of the optimization. For a portion of the processing conditions, the effectiveness degree calculating section 851 scores a high calculation value when the settings are changed from the default conditions, and scores a low calculation value when the settings are not changed. For a portion of the processing conditions, the effectiveness degree calculating section 851 scores a high calculation value when the processing conditions that are set are favorable, and scores a low calculation value when the processing conditions are not favorable. There are no particular restrictions on the magnitude of the allotment of the multiple processing conditions, the number of levels of the calculation value, and the scoring method.

Figure 7:
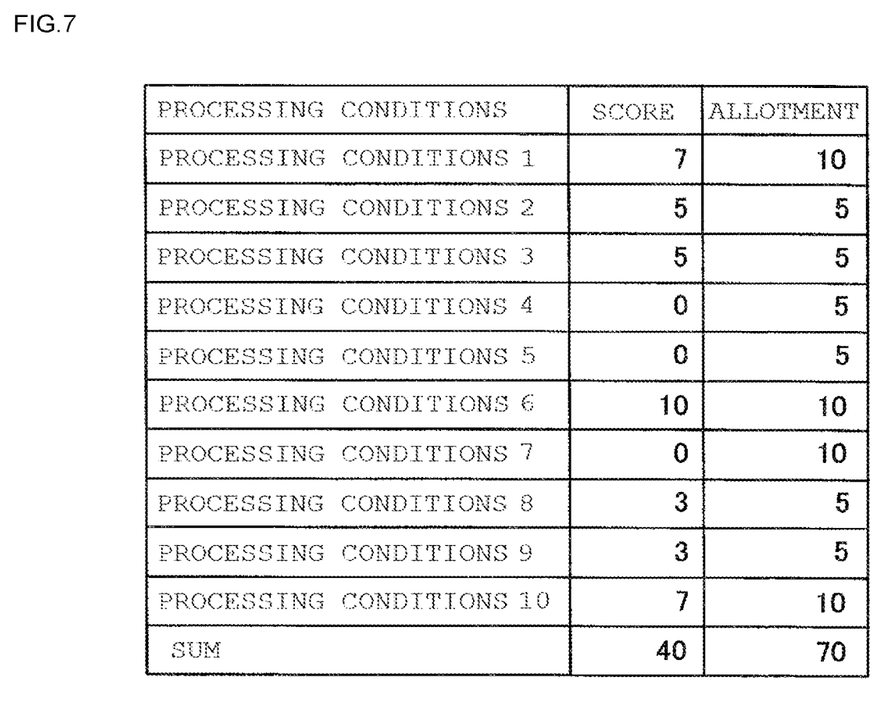
FIG. 7 is a diagram of a display example which explains by example the process results of an effectiveness degree processing section.

FIG. 7 is a diagram of a display example which explains by example the process results of the effectiveness degree processing section 85. The effectiveness degree display section 852 displays the process results using a list display format, for example. In the example of FIG. 7, the calculation values which are scored and the allotments are illustrated for the ten items of processing conditions 1 to 10. The allotments of the processing conditions are set to 5 points or 10 points and the sum thereof is 70 points at full points. The effectiveness degree of the optimization is illustrated by the total point of the calculation values which are scored and is 40 points in the example of FIG. 7.

For example, the processing condition 6 sets the height H of the mounted component on the lower face of the board K and is allotted 10 points. When the height H is set appropriately according to the properties of the board K to be produced, since the positioning of the board K is performed in a short time, the illustrated full 10 points are scored. When the setting of the height H is not changed from the maximum height Hmax of the default value, since it takes time to position the board K, 0 points are scored. When the height H is set to be less than the height of the components which are actually mounted, there are concerns of interference when the board K is conveyed. At this time, the optimization processing section 82 displays a setting error without starting the optimization process and urges the operator to amend the settings.

For example, the processing condition 7 sets the optimization time which can be spent on the optimization process and is allotted 10 points. When the optimization time is set to unlimited, since the optimization process is carried out without being cut off part way through, the maximum points, 10 points are scored. Due to reasons such as restrictions in the production schedule, when the optimization time is set to a certain time, 5 points are scored. When the optimization time is not subjected to a setting change from the minimum time of the default value, since there is a concern that a sufficient optimization process will not be carried out, the illustrated 0 points are scored.

The operator is capable of totally checking the effectiveness degree based on the total point of the calculation values to determine whether or not the optimization process is performed under appropriate processing conditions. When the total point of the calculation values is low, the operator is capable of checking the calculation value of each of the processing conditions and amending inappropriate settings and forgotten settings of the processing conditions which are caused to carry out the optimization process again.

As described earlier, when the process selecting section 81 selects multiple sections from among the line balance processing section 83, the operation efficiency processing section 84, and the effectiveness degree processing section 85, the common display section 86 functions. The common display section 86 displays multiple items from among the line balance efficiency LBE, the operation efficiency M, and the effectiveness degree (the total point of the calculation values) of the optimization together. Accordingly, the operator is capable of accurately determining whether or not excellent optimization results are obtained in overall consideration of the multiple items that are displayed.

For example, there is a case in which the operation efficiency M of each of the component mounting machines 21 to 2A is low and the cycle time tc is long. In this case, when the cycle times tc of the component mounting machines 21 to 2A are approximately the same length and are balanced, the line balance efficiency LBE is a high numerical value. However, such optimization results are not appropriate. As a countermeasure for rendering this easy to see, the common display section 86 displays the line balance efficiency LBE together with the operation efficiencies M of the component mounting machines 21 to 2A on a single screen. Accordingly, the operator is capable of visually recognizing both the line balance efficiency LBE and the operation efficiencies M together, and is capable of accurately determining that the optimization results are excellent only when both are high.

6. Modes and Effects of Optimization Device 7 of Component Mounting Line of Embodiment The optimization device 7 of the component mounting line 1 of the embodiment is the optimization device 7 of the component mounting line 1 which carries out an optimization process relating to production based on setting-changeable processing conditions when producing the board K on the component mounting line 1 in which the multiple component mounting machines 2 are arranged in series, each of the component mounting machines 2 including the board conveyance device 3 which carries in the board K to a mounting execution position, positions the board K, and carries out the board K, the component supply device 4 which sequentially supplies components, and the component transfer device 5 which picks the components from the component supply device 4 and mounts the components onto the positioned board K, the optimization device 7 including the cycle time calculating section 831 which calculates the respective cycle times tc required for mounting components of component types which are allocated to each of the component mounting machines 21 to 2A by the optimization process onto the single board K, the excluded machine setting section 832 which sets a specific portion of the component mounting machines (the tenth component mounting machine 2A) to be excluded from further calculation processes, the balance efficiency calculating section 833 which calculates the line balance efficiency LBE indicating a degree to which the cycle times tc of the first to the ninth component mounting machines 21 to 29 which are not excluded are equalized, and the balance efficiency display section 834 which displays the line balance efficiency LBE.

Accordingly, after the specific component mounting machines (the tenth component mounting machine 2A) which are likely to become a cause of worsening the line balance efficiency LBE are excluded from the calculation process, the line balance efficiency LBE is calculated and displayed. Therefore, the operator is capable of checking the line balance efficiency LBE which is effective to appropriately evaluate the results of the optimization process without the line balance efficiency LBE being worsened by a specific component mounting machine. When the line balance efficiency LBE is not favorable, the operator is capable of updating the settings of the processing conditions, carrying out the optimization process again, obtaining excellent optimization results, and utilizing the original device performance of the component mounting line 1.

Furthermore, a specific portion of the component mounting machines which is excluded by the excluded machine setting section 832 is any of component mounting machines in which the cycle time tc is shorter than the others, component mounting machines in which the number of types or the number of components of the allocated component types is fewer than the others, and component mounting machines in which a structure of at least one of the component supply device 4A and the component transfer device 5 is different from the others and components of specific component types are allocated. Accordingly, the component mounting machines (the tenth component mounting machine 2A) which worsen the line balance efficiency LBE are reliably excluded and it is possible to accurately calculate the line balance efficiency LBE which has high effectiveness.

The optimization device 7 of the component mounting line 1 of the embodiment may be provided with the cycle time calculating section 841 which calculates respective cycle times tc required for mounting components of component types which are allocated to each of the component mounting machines 21 to 2A by the optimization process onto the single board K, the shortest time calculating section 842 which calculates respective shortest cycle times tmin in which it is possible to mount components of component types which are allocated to each of the component mounting machines 21 to 2A by the optimization process on the single board K under mount-execution conditions at which it is anticipated that mounting efficiency will be highest, the operation efficiency calculating section 843 which calculates respective operation efficiencies M indicating a degree to which the cycle time tc of each of the component mounting machines 21 to 2A approaches the shortest cycle time tmin, and the operation efficiency display section 844 which displays the operation efficiencies M.

Accordingly, the operation efficiency M indicating the degree to which the cycle time tc approaches the shortest cycle time tmin is calculated and displayed for each of the component mounting machines 21 to 2A. Therefore, the operator is capable of checking the operation efficiency M of each of the component mounting machines 21 to 2A and appropriately evaluating the results of the optimization process. When the operation efficiency M is low, the operator is capable of amending inappropriate settings and forgotten settings of the processing conditions which are a cause, carrying out the optimization process again, obtaining excellent optimization results, and utilizing the original device performance of the component mounting line 1.

The optimization device 7 of the component mounting line 1 of the embodiment may be provided with the effectiveness degree calculating section 851 which calculates an effectiveness degree of optimization of the processing conditions which are set for carrying out the optimization process, and the effectiveness degree display section 852 which displays the effectiveness degree of the optimization.

Accordingly, the effectiveness degree (the total point of the calculation values) of the optimization of the processing conditions which are set is calculated and displayed. Therefore, the operator is capable of checking the effectiveness degree and determining whether or not the optimization process is performed under appropriate processing conditions. When the effectiveness degree (the total point of the calculation values) is low, the operator is capable of amending inappropriate settings and forgotten settings of the processing conditions which are a cause, carrying out the optimization process again, obtaining excellent optimization results, and utilizing the original device performance of the component mounting line 1.

Furthermore, the effectiveness degree calculating section 851 uses a calculation method of changing a calculation value of the effectiveness degree of the optimization according to whether or not settings of the processing conditions are changed from default conditions, and a calculation method of changing the calculation value of the effectiveness degree of the optimization according to a quality of the processing conditions which are set. Accordingly, since the effectiveness degree of the optimization is understood for each of multiple processing conditions, the operator is capable of easily amending inappropriate settings and forgotten settings of the processing conditions which are a cause of a reduction in the effectiveness degree.

The optimization device 7 of the component mounting line 1 of the embodiment is further provided with the common display section 86 which displays multiple items from among the line balance efficiency LBE, the operation efficiency M, and the effectiveness degree (the total point of the calculation values) of the optimization together. Accordingly, the operator is capable of accurately determining whether or not the optimization results are excellent in overall consideration of the multiple items that are displayed.

The modes of the optimization device 7 of the component mounting line 1 of the embodiment can be carried out as the optimization method of the component mounting line 1. The optimization method of the component mounting line 1 of the embodiment is capable of realizing at least one function of the optimization processing section 82, the line balance processing section 83, and the operation efficiency processing section 84 instead of multiple processing steps. The effects of the optimization method of the component mounting line 1 of the embodiment are the same as the effects of the optimization device 7.

7. Adaptations and Modification of Embodiment

In the embodiment, the optimization device 7 is provided with the line balance processing section 83, the operation efficiency processing section 84, and the effectiveness degree processing section 85; however, the configuration is not limited thereto. In other words, the minimum configuration of the optimization device 7 may be provided with one of any of the line balance processing section 83, the operation efficiency processing section 84, and the effectiveness degree processing section 85 in addition to the optimization processing section 82.

Furthermore, the line balance efficiency LBE which indicates the degree to which the cycle times tc of the component mounting machines are equalized may be defined differently from equation 1 or equation 2 and a different calculation method may be applied. The effectiveness degree calculating section 851 scores the calculation values for the ten items of the processing conditions 1 to 10; however, the configuration is not limited thereto. For example, it is possible to perform the setting in which processing conditions to be scored are added or omitted according to the operational status such as the properties of the board K and the machine type of the component mounting machine 2 and to increase or decrease the number of items from 10 items. It is possible to apply various other adaptations and modifications to the present disclosure.

REFERENCE SIGNS LIST

1: component mounting line, 2: component mounting machine, 21 to 2A: first to tenth component mounting machine, 3: board conveyance device, 4: component supply device, 4A: component supply device formed from tray device, 5: component transfer device, 7: optimization device of component mounting line, 71: computer device, 81: process selecting section, 82: optimization processing section, 83: line balance processing section, 831: cycle time calculating section, 832: excluded machine setting section, 833: balance efficiency calculating section, 834: balance efficiency display section, 84: operation efficiency processing section, 841: cycle time calculating section, 842: shortest time calculating section, 843: operation efficiency calculating section, 844: operation efficiency display section, 85: effectiveness degree processing section, 851: effectiveness degree calculating section, 852: effectiveness degree display section, 86: common display section

The invention claimed is:

1. An optimization device of a component mounting line which carries out an optimization process relating to production based on setting-changeable processing conditions when producing a board on the component mounting line in which multiple component mounting machines are arranged in series, each of the component mounting machines including a board conveyance device which carries in the board to a mounting execution position, positions the board, and carries out the board, a component supply device which sequentially supplies components, and a component transfer device which picks the components from the component supply device and mounts the components onto the positioned board, the optimization device comprising:
   a processor configured to:
      calculate respective cycle times required for mounting components of component types which are allocated to each of the component mounting machines by the optimization process onto a single board;
      set a specific portion of the component mounting machines to be excluded from further calculation processes;

calculate a line balance efficiency indicating a degree to which the cycle times of the component mounting machines which are not excluded are equalized; and control a display to display the line balance efficiency, wherein the specific portion of the component mounting machines which is excluded is any of component mounting machines in which the cycle time is shorter than the others, component mounting machines in which a number of types or a number of components of the allocated component types is fewer than the others, and component mounting machines in which a structure of at least one of the component supply device and the component transfer device is different from the others and components of specific component types are allocated.

2. The optimization device of a component mounting line according to claim 1, wherein the processor is configured to control the display to display the line balance efficiency, an operation efficiency, and an effectiveness degree of optimization together.

3. The optimization device of a component mounting device according to claim 1, wherein the processor is configured to control the display to display a number representing the degree to which the cycle times of the component mounting machines which are not excluded are equalized as the line balance efficiency.

4. The optimization device of a component mounting device according to claim 3, wherein the processor is configured to control the display to display a percentage representing the degree to which the cycle times of the component mounting machines which are not excluded are equalized as the line balance efficiency.

5. An optimization device of a component mounting line which carries out an optimization process relating to production based on setting-changeable processing conditions when producing a board on the component mounting line in which multiple component mounting machines are arranged in series, each of the component mounting machines including a board conveyance device which carries in the board to a mounting execution position, positions the board, and carries out the board, a component supply device which sequentially supplies components, and a component transfer device which picks the components from the component supply device and mounts the components onto the positioned board, the optimization device comprising:

a processor configured to:

calculate respective cycle times required for mounting components of component types which are allocated to each of the component mounting machines by the optimization process onto a single board;

calculate respective shortest cycle times required for mounting the components of component types which are allocated to each of the component mounting machines by the optimization process on the single board without restricting processing conditions set by the optimization process;

calculate respective operation efficiencies indicating a degree to which the cycle time of each of the component mounting machines approaches the shortest cycle time; and control a display to display the operation efficiencies.

6. The optimization device of a component mounting device according to claim 5, wherein without restricting processing conditions set by the optimization process includes setting at least one of a speed and an acceleration to a maximum value.

7. The optimization device of a component mounting device according to claim 5, wherein without restricting processing conditions set by the optimization process includes setting at least one of a conveyance speed and an operation speed to a maximum value.

8. The optimization device of a component mounting device according to claim 5, wherein without restricting processing conditions set by the optimization process includes setting a conveyance speed of the single board to a maximum value and setting an acceleration of the single board to a maximum value.

9. The optimization device of a component mounting device according to claim 5, wherein without restricting processing conditions set by the optimization process includes setting an operation speed of a nozzle to a maximum value and setting an acceleration of the nozzle to a maximum value.

10. The optimization device of a component mounting device according to claim 5, wherein without restricting processing conditions set by the optimization process includes setting a number of types of an item which are available for use to a maximum value.

11. The optimization device of a component mounting device according to claim 10, wherein the item is a nozzle.

12. The optimization device of a component mounting device according to claim 5, wherein without restricting processing conditions set by the optimization process includes setting a number of exchanges of an item to a minimum value.

13. The optimization device of a component mounting device according to claim 12, wherein the item is a nozzle.

14. The optimization device of a component mounting device according to claim 5, wherein the processor is configured to control the display to display a line balance efficiency, the operation efficiencies, and an effectiveness degree of optimization together.

15. An optimization device of a component mounting line which carries out an optimization process relating to production based on setting-changeable processing conditions when producing a board on the component mounting line in which multiple component mounting machines are arranged in series, each of the component mounting machines including a board conveyance device which carries in the board to a mounting execution position, positions the board, and carries out the board, a component supply device which sequentially supplies components, and a component transfer device which picks the components from the component supply device and mounts the components onto the positioned board, the optimization device comprising:

a processor configured to:

calculate an effectiveness degree of optimization of the processing conditions which are set for carrying out the optimization process; and control a display to display the effectiveness degree of the optimization, wherein the processor uses at least one of a calculation method of changing a calculation value of the effectiveness degree of the optimization according to whether or not settings of the processing conditions are changed from default conditions, and a calculation method of changing the calculation value of the effectiveness degree of the optimization according to a quality of the processing conditions which are set.

16. The optimization device of a component mounting device according to claim 15, wherein the processor is configured to set the calculation value higher when a setting is changed from a default condition than when the setting is not changed from the default condition.

17. The optimization device of a component mounting device according to claim 15, wherein the processor is configured to set the calculation value higher when a processing condition is favorable than when the processing condition is not favorable.

18. The optimization device of a component mounting device according to claim 15, wherein the processor is configured to control the display to display a line balance efficiency, an operation efficiency, and the effectiveness degree of the optimization together.

* * * * *

UNITED STATES PATENT AND TRADEMARK OFFICE
CERTIFICATE OF CORRECTION

PATENT NO.        : 10,671,049 B2
APPLICATION NO.   : 15/561300
DATED             : June 2, 2020
INVENTOR(S)       : Yoshihiro Yasui et al.

It is certified that error appears in the above-identified patent and that said Letters Patent is hereby corrected as shown below:

On the Title Page

Item (71), the Applicant's name is incorrect. Item (71) should read:
-- (71) Applicant: FUJI CORPORATION, Chiryu-shi (JP) --

Signed and Sealed this
Fourth Day of August, 2020

Andrei Iancu
*Director of the United States Patent and Trademark Office*